United States Patent [19]

Thery et al.

[11] Patent Number: 4,717,786

[45] Date of Patent: Jan. 5, 1988

[54] THERMOCOUPLE ARRAY FOR A THERMAL FLUXMETER

[75] Inventors: Pierre Thery, Villeneuve D'Ascq; Guy Ravalitera; Michel Cornet, both of Bethune, all of France

[73] Assignee: Agence Nationale de Valorisation de la Recherche, France

[21] Appl. No.: 840,695

[22] Filed: Mar. 18, 1986

Related U.S. Application Data

[63] Continuation-in-part of Ser. No. 637,217, Jul. 17, 1984.

[30] Foreign Application Priority Data

Nov. 18, 1982 [FR] France .................... 82 19336

[51] Int. Cl.⁴ .......................................... H01L 35/28
[52] U.S. Cl. ................................ 136/212; 136/225; 136/211; 374/179
[58] Field of Search ............... 136/224, 225, 205, 211, 136/212, 232, 233, 237; 374/174, 178, 179; 62/3

[56] References Cited

U.S. PATENT DOCUMENTS

| | | |
|---|---|---|
| 2,844,638 | 7/1958 | Lindenblad ........................ 136/212 |
| 3,449,173 | 6/1969 | Rupprecht et al. ................. 136/205 |
| 3,644,913 | 2/1972 | Matsui ............................... 136/211 |
| 3,981,751 | 9/1976 | Dashevsky et al. ................ 136/225 |
| 4,029,521 | 6/1977 | Korn et al. ......................... 136/225 |
| 4,197,738 | 4/1980 | Degenne ............................ 136/225 |
| 4,382,154 | 5/1983 | Thery et al. ........................ 136/225 |

FOREIGN PATENT DOCUMENTS

1180015 10/1964 Fed. Rep. of Germany ...... 136/212

OTHER PUBLICATIONS

Building Applications of Heat Flux Transducers, Symposium Paper, ASTM Committee C-16 on Thermal Insulation, Sep. 1983.

*Primary Examiner*—Charles T. Jordan
*Assistant Examiner*—John W. Eldred
*Attorney, Agent, or Firm*—Ostrolenk, Faber, Gerb & Soffen

[57] ABSTRACT

Thermal fluxmeter with a plurality of thermocouples comprising a continuous thin layer of a first conductor or semiconductor material such as constantan, covered on at least one of its faces by a succession of areas comprised of very thin deposits of a second conductor or semiconductor material such as copper, having a thermoelectric power different from that of the first material; the characteristic of the invention is that at least one channel traverses from side to side through each deposit area and through the underlying thin layer, said channels being offset in the same direction with respect to the center of the traversed area; said channels may be provided with an inner coating of a deposit of the second material; appropriately, the thin layer is deposited on a substrate of insulating material.

21 Claims, 11 Drawing Figures

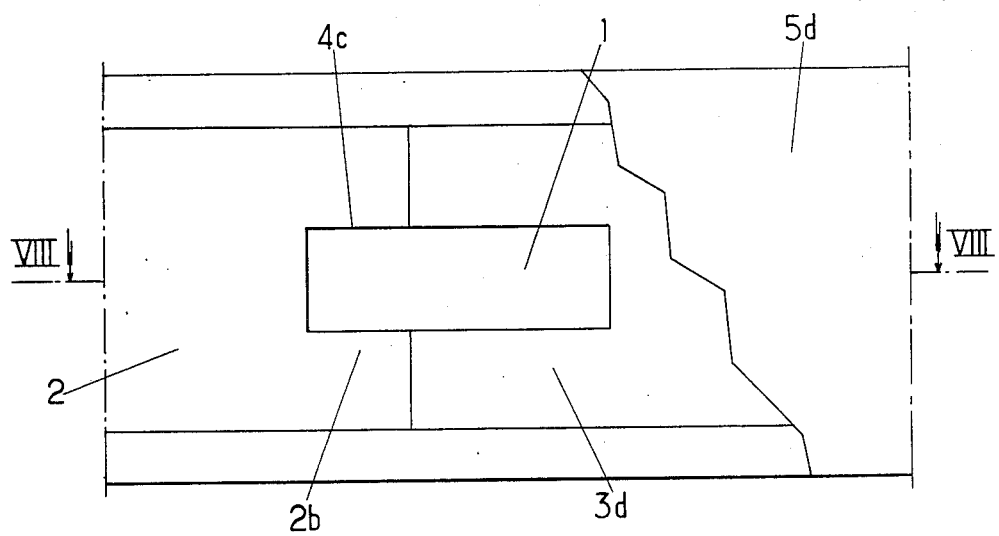
FIG.8.
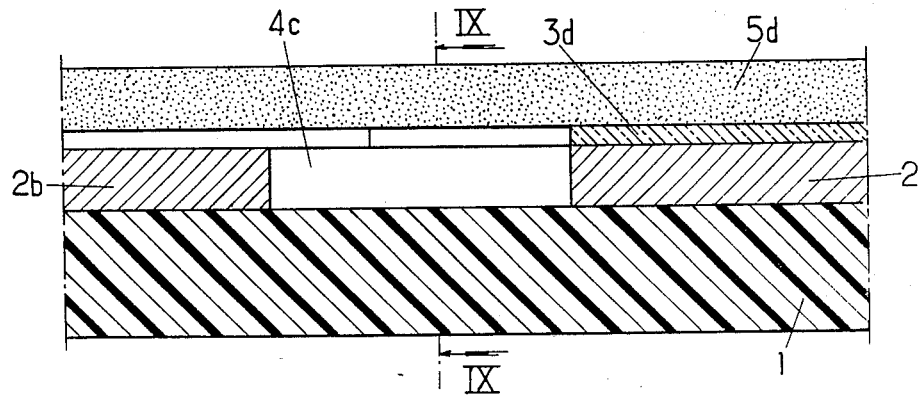
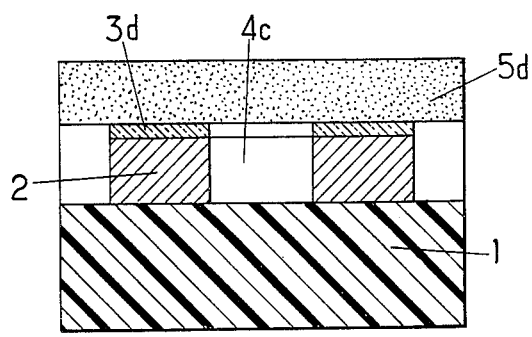
FIG.9.

THERMOCOUPLE ARRAY FOR A THERMAL FLUXMETER

CROSS-REFERENCE TO RELATED APPLICATION

This is a continuation-in-part of application Ser. No. 637,217, filed July 17, 1984.

BACKGROUND AND SUMMARY OF THE INVENTION

The present invention, which is a continuation-in-part application of U.S. Ser. No. 637,217 filed July 17, 1984, relates to a thermocouple array for a thermal fluxmeter, namely to a device for measuring a thermal flux resulting from a temperature gradient and more particularly to a thermal fluxmeter having in its array several tens and preferably several hundreds or thousands of elementary thermocouples connected in series.

In the European Pat. No. 0 030 499 granted to the assignee of the present application on Aug. 8, 1984 and to which corresponds U.S. Pat. No. 4,382,154 issued to Thery et al on May 3, 1983, a thermal fluxmeter is described (more particularly with reference to FIGS. 3, 4 and 5 of these European and U.S. patents), said fluxmeter comprising, along a meandering path (FIG. 3), a succession of elementary thermocouples connected in series (FIGS. 4 and 5); this fluxmeter includes a plate made of a plastics material coated with a thin meandering layer or strip of a first conducting or semi-conducting substance, such as the alloy named constantan, this thin strip or layer being itself coated with a succession of zones, separated from each other, of an electrolytic thinner deposit of a second conducting or semi-conducting material, such as copper, having a thermoelectric power different from that of the first conducting or semi-conducting material. In the embodiment shown in FIG. 4 of these patents, said zone had a dissymmetrical form (dove-tail shape of the zone), whereas in the embodiment shown in FIG. 5 of both these European and U.S. patents the device comprised a succession of resin coatings each overlapping a portion of said zones and an adjacent portion of the strip or layer not coated with the deposit of said second material, thus providing again a dissymmetry. The elementary cells or thermocouples were connected in series by the strip or layer of the first material, which was continuous. It is the dissymmetry in the transverse direction which allowed an electromotive force to be generated in the series assembly of thermocouples, said electromotive force depending on the temperature difference to which each elementary cell was subjected, as the first and second above mentioned materials had different thermoelectric properties.

Furthermore, a thermal fluxmeter is known from the U.S. Pat. No. 4,197,738 issued to Monsieur Degenne on Apr. 15, 1980. This thermal fluxmeter is formed by series connected thermocouples and comprises a relatively thick plate made from an insulating material pierced with two series of transverse channels passing through the whole thickness of the plate; on each face of this plate is disposed a series of layers of a first conducting material separated from each other by narrow strips of the plate not coated with this first conducting material; furthermore, the channels are coated along their whole surface, the channels of the first series being coated with said first conducting material, whereas the channels of the second series are coated with a second conducting material, said two materials having different thermoelectric powers; finally, rings of the second conducting material surround the upper and lower edges of the channels of the second series of channels. The first material may be copper and the second material nickel. It will be noted that neither the coated layers of the first conducting material nor the coated layers of the second conducting material are continuous, but form an assembly of discontinuous surfaces (on the faces of the plate and on the inner periphery of the channels).

On the other hand, U.S. Pat. No. 4,029,521 issued to Korn et al on June 14, 1977 describes a thermoelectric detector comprising an inner support, a continuous strip of a first material, having a meandering shape, and a succession of discrete deposits of a second material disposed on this strip, the thermoelectric powers of these two materials being different; hot and cold zones are formed by using reflecting elements E, radiation absorbing elements G and conducting elements F forming a heat sink, these elements E, G and F creating hot and cold zones at the ends of the discrete deposits B disposed on a continuous strip A. No channel is provided through the deposits B and/or the strip A.

Finally two other U.S. Pats., i.e. No. 4,363,927 issued Dec. 14, 1982 to Wilson and No. 3,267,727 issued Aug. 23, 1966 to Benzinger, also disclose thermoelectric generators having a meandering structure.

Contrary to the prior techniques, the present invention relates to a thermal fluxmeter with a great number of thermocouples, comprising, on an insulating substrate, at least one thin continuous layer of a first conducting or semi-conducting material coated on at least one of its faces with a succession of zones, separated from each other and formed by thinner deposits of a second conducting or semi-conducting material having a thermoelectric power different from that of said first material, characterized by the fact that respective channels pass right through at least part of at least most of said zones and through the thin continuous layer, underlying said zones, without interrupting the continuity of said thin layer, these channels being offset in the same direction with respect to the center of each zone passed through.

Preferably, said channels are coated internally with a deposit of the second material.

Advantageously, said thin continuous layer is in the shape of a strip which is preferably meandering, being bent so as to form a rectangular or square structure.

In a first embodiment, the thin continuous layer is deposited on a substrate of an insulating material and it is coated on one face only, namely the one opposite the face fixed to the substrate, with thinner deposit zones.

In a second embodiment, the thin layer is coated on both faces with thinner deposit zones, the zones of one of the faces partially overlapping the zones of the other face on each side of the thin layer and each channel, which passes not only through the thin layer, but also through the overlapping portions of the two thinner deposits on each side of the thin layer, is offset with respect to the center of each of the two deposits in opposite directions above and below the layer.

Advantageously, the succession of the deposit zones and the portion not covered (by such zones) of the thin continuous layer or of the coated face or faces is coated with resin layers.

Each channel may open either within a deposit zone, or astride such a zone and a non-coated portion of the thin layer.

In another type of embodiment, the assembly of the thin continuous layer and of the zones deposited on one or both sides of said thin continuous layer is placed between two cover plates of an insulating material, notches being made in said zones so as to be surrounded along most of their sides by the respective deposit and each of said notches being extended by one of said channels traversing said thin continuous layer, said notches and channels being offset relatively to the center of the zones on one face of said thin continuous layer in a same direction along the longitudinal direction, although possibly meandrous, of said layer.

Advantageously the external surface of each cover plate, which is not in contact with said zones, is covered with a coating of a heat conducting material.

In a specific embodiment of this type there are two thin continuous strips located against opposite faces of a central plate of an insulating material, each thin continuous strip having said zones on the face thereof which is not in contact with said central plate.

Preferably, in this specific embodiment, the notches and channels corresponding to one thin continuous layer are offset in a first direction relatively to the longitudinal elongation (possibly in a meander) of the layer, whereas the notches and channels corresponding to the other thin continuous layer are offset in a second direction relatively to said longitudinal elongation, said second direction being opposite to said first direction.

The thermal fluxmeter of the invention may comprise several hundred elementary thermocouples, namely as many as there are zones on a face or each of the faces of the thin continuous layer.

Preferably the first material is the alloy constantan and the second material copper.

It will be noted that a device in accordance with the invention is distinguished essentially from the thermal fluxmeters described in European Pat. No. 0,030,499 and U.S. Pat. Nos. 4,382,154 and 4,029,521 by the presence of channels or notches, not provided in these previous patents, and from the fluxmeter described in U.S. Pat. No. 4,197,738 by the fact that the thin layer is continuous, whereas in this last U.S. patent none of the upper or lower coatings is continuous.

BRIEF DESCRIPTION OF THE DRAWINGS

Other objects and advantages of the present invention will become more apparent from the following detailed description of the preferred embodiments thereof to be read in conjunction with the accompanying drawings, wherein:

FIGS. 7, 8 and 9 show, respectively a top view with part of the upper protecting layer cut away, a sectional view of VIII—VIII through FIG. 7 and a sectional view through IX—IX of FIG. 8, of a thermal fluxmeter portion according to a third embodiment of the invention.

DETAILED DESCRIPTION

Figure 1:
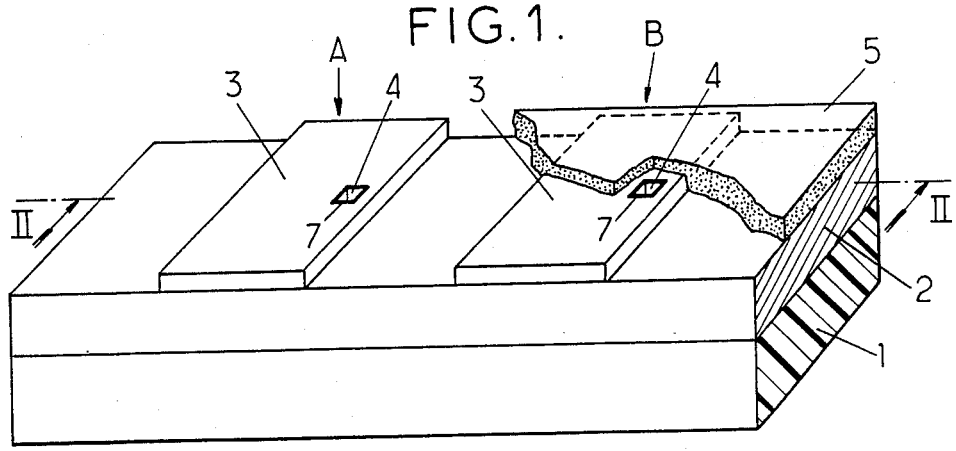
FIGS. 1 and 2 show, respectively in isometric perspective (with part of the upper protecting resin layer cut away) and in partial section (through II—II of FIG. 1), a portion, comprising two elementary cells or thermocouples, of a thermal fluxmeter according to a first embodiment of the invention.
Figure 2:
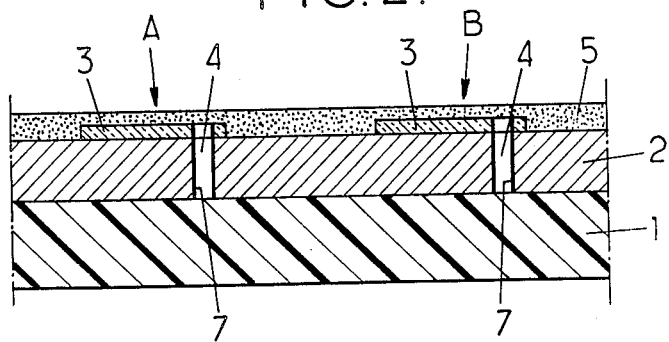

Referring first of all to FIGS. 1 and 2 illustrating a first embodiment of the invention, there are shown therein two elementary cells or thermocouples A and B, disposed in series, forming a portion of the fluxmeter.

The assembly of the thermal fluxmeter comprises in this embodiment:

a supporting plate, strip or film 1 made from a plastic material, for example polyimide or epoxy glass, and forming the substrate;

a thin uninterrupted layer 2 made from a first conducting or semi-conducting material, for example constantan (with 35 to 50% nickel, the complement to 100% being copper, and preferably with 40% nickel and 60% copper, the constantan with 43% nickel usually used for manufacturing electric resistors also being very suitable) or P doped silicon;

a series of very thin deposits 3 (thinner than the layer 2) obtained preferably electrolytically, made from a second conducting or semi-conducting material, for example copper, iron, zinc, bismuth telluride or lead sulfide;

a series of channels or holes 4 pierced in the first and in the second material in the vicinity of one end (in the longitudinal direction) of each of at least most of the very thin deposits of the second material, each channel 4 opening, in this embodiment, within a deposit 3;

finally, if required an upper layer 5 of a protecting resin deposited by silk-screen printing, as the flexible layers used in printed circuit technology.

Figure 3:
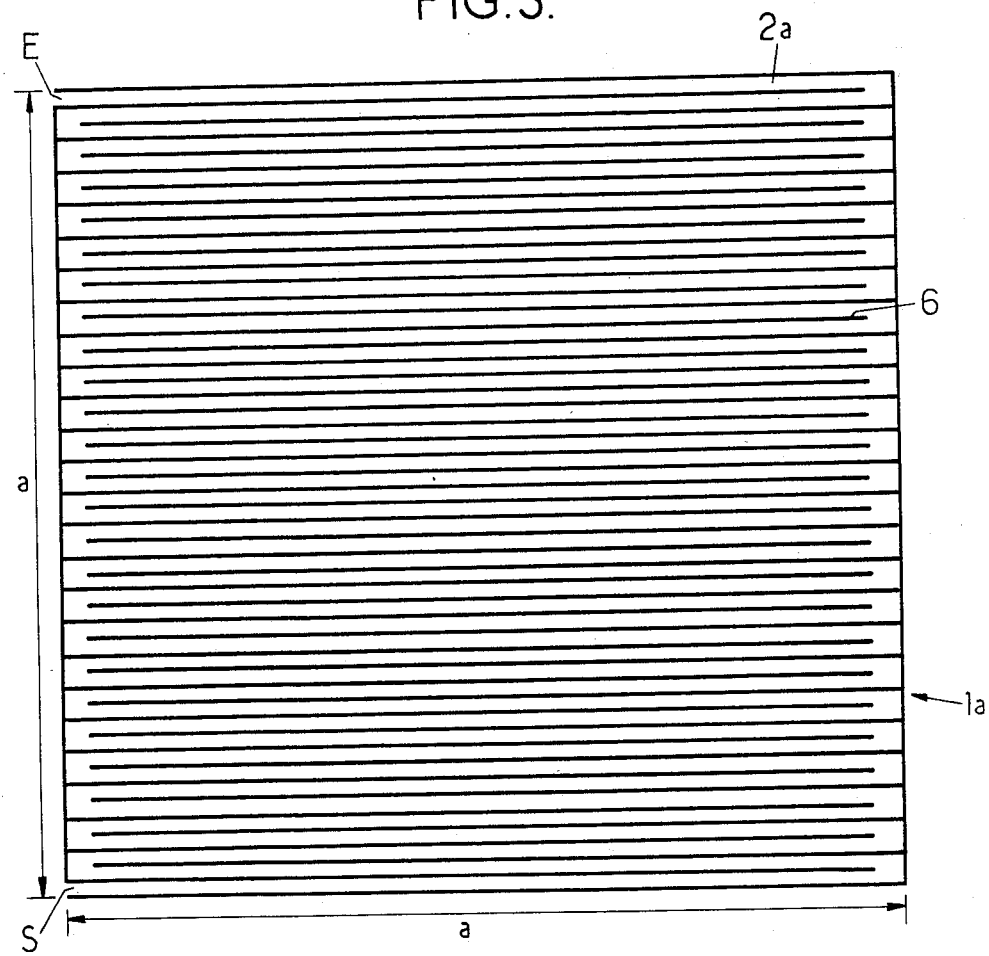
FIG. 3 is a top plan view of the whole of a fluxmeter in accordance with the invention.

A very advantageous compact arrangement of a large number of elementary cells or thermocouples of the type A, B shown in FIGS. 1 and 2 is illustrated in FIGS. 3 (general view) and 4 (partial view, but on a larger scale).

The support is then formed by a plate 1a made from a plastics material (polyimide or epoxy resin for example) having a rectangular or square shape on which is bonded a constantan sheet of a thickness of 25 microns, which has then been etched by iron perchloride along parallel lines 6 forming two intermixed combs, by the conventional etching technique used for manufacturing printed circuits (a photosensitive resin protection layer inert to the iron perchloride was deposited on the whole of the constantan sheet, then this layer was removed along the parallel lines 6 before proceeding to iron perchloride etching which was only active along these lines).

Thus a meandering strip 2a of constantan was obtained. For example, in a square of 130 mm each side (a equals 130 mm) a meandering strip 2a of length of 7250 mm was accommodated.

On the meandering strip 2a copper layers 3a were deposited electrolytically having a thickness of a few microns and a length of 2.5 mm, the spacing between these layers being 2.5 mm for example (b=2.5 mm and c=2.5 mm). Copper coating then took place after protection, by means of a photosensitive resin layer, of the portions which were not to be copper plated.

Then holes 4a having a section of 1.3 mm×0.6 mm were etched.

These holes may be coated on the inside with a layer 7 of the second conducting or semi-conducting material, particularly copper.

Finally, the upper face (on the copper coated and non coated parts) of the device is coated with a layer 5 (see FIGS. 1 and 2) of a heat curable resin protecting the copper and the constantan from oxidation whose thickness and thermal characteristics are chosen so as to optimize the sensitivity of the sensor.

Thus finally a meandering circuit is obtained comprising 1250 elementary cells or thermocouples of type A, B connected in series, a first terminal being at E (input) and a second terminal at S (output) in FIG. 1.

The surface resistance of the device of FIGS. 1 to 4 is 20 milliohms for a constantan sheet of 25 microns thickness; for a meandering strip of this thickness, having a length of 7250 mm and a width of 1.8 mm, the electric resistance is of the order of 80 ohms. It will be noted that, despite the presence of the holes 4 (in FIGS. 1 and 2) and 4a (in FIG. 4), the constantan strip is continuous, thereby ensuring the series connection of the elementary cells or thermocouples such as A and B.

Figure 5:
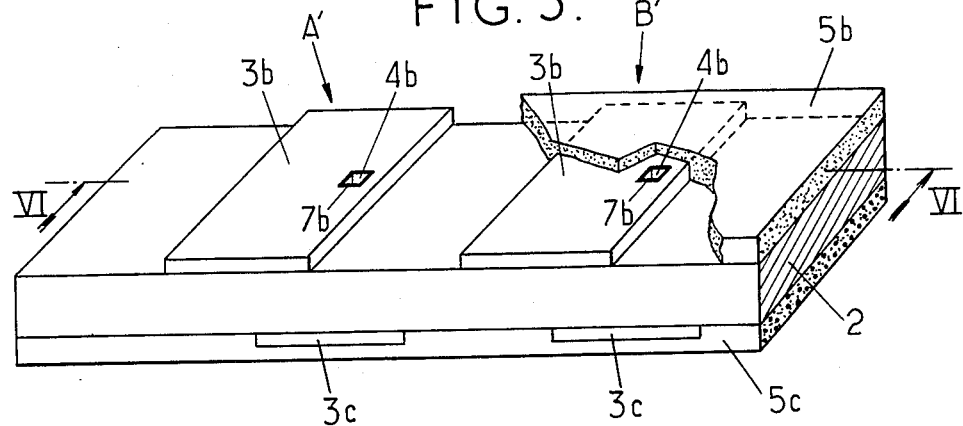
FIGS. 5 and 6 show, respectively in isometric perspective (with part of the upper protecting resin layer cut away) and in partial section (through VI—VI of FIG. 5), a portion, comprising two elementary cells or thermocouples of a thermal fluxmeter according to a second embodiment of the invention.
Figure 6:
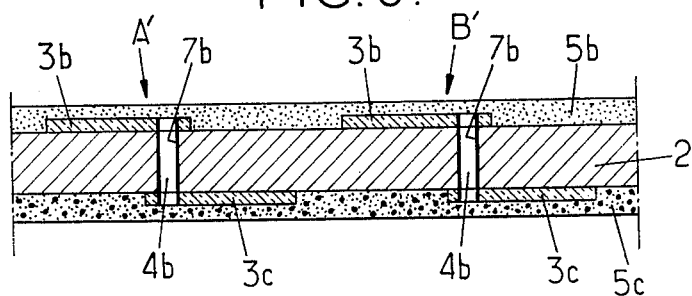

In FIGS. 5 and 6 has been shown a second embodiment of the invention.

In this embodiment: the first support or substrate 5b is made from polyimide with an adhesive polymerizable at 150° C., the continuous layer 2 of the first conducting or semi-conducting material (constantan or P doped silicon for example) being provided on both faces with very thin deposits 3b and 3c of a second conducting or semi-conducting material, such as copper, partially overlapping layer 2 on each side. In this case also, through-holes or channels 4b are provided through deposits 3b, 3c and layer 2. These holes are copper coated on the inside (layer 7b) to provide the electric contact between a pair of partially overlapping deposits 3b and 3c. Finally, a resin layer 5c, similar to layer 5 in FIGS. 1 and 2, covers and protects the lower face of layer 2 partially coated with copper deposits. It will be noted that, as in the first embodiment, the layer 2 of the first conducting or semi-conducting material is continuous, despite the existence of holes 4b, thereby ensuring the series connection of the elementary cells or thermocouples A' and B'.

The thermal properties of the adhesive support and of the protecting resin are different and are chosen so as to optimize the sensitivity.

Figure 4:
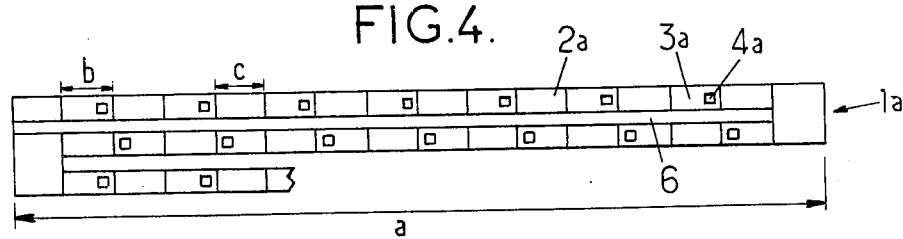
FIG. 4 is a view similar to that of FIG. 3, but on a larger scale and limited to a portion of the fluxmeter, the upper protecting resin layer having been removed.

A series of elementary cells A', B' may be disposed in the configuration shown in FIGS. 3 and 4, as for the first embodiment. The assembly of the type illustrated in FIG. 3 may then be disposed on an adhesive support of small thickness so as to form a highly sensitive thermal fluxmeter. For example, with a device comprising 1250 cells A', B' on an area of 125 mm×125 mm (A=125), the width of the meandering constantan strip being 1.8 mm and the spacing between the parallel strip portions being 0.4 mm; the copper deposits had a length of 2.1 mm (distance b in FIG. 4) and they were separated by non-copper coated gaps of 0.7 mm (distance c in FIG. 4). The sensitivity of this device was of the order of 1.5 mV/W/dm$^2$, with the same thickness for the constantan and the copper as in the first embodiment.

The sensitivity increases with the number of elements. But it is easy to integrate the device of the invention. Thus a sensitivity of the order of 6 mV/W/dm$^2$ can be obtained with elementary cells of the smallest dimension.

The operation of a device such as shown in FIGS. 1 and 2 (first embodiment) in conjunction with FIGS. 3 and 4 is as follows.

If a temperature difference is applied between the upper face and the lower face of the device shown in the FIGS. 1 to 4, that is if a thermal flux passes through this fluxmeter from bottom to top or from top to bottom (considering FIG. 2), it can be noted first of all that, if the fluxmeter had no channels or holes 4, no potential difference would be available between terminals E and S, for there would be no effect of dissymmetry for creating a temperature difference in the horizontal plane (still considering FIG. 2), which horizontal temperature difference allows generation of electricity by the thermocouple of the invention. It is the holes or channels 4 which provide thermal dissymmetry, because the thermal flux preferentially avoids these holes, since air is a very poor heat conductor, whereas the first and second conducting or possibly semi-conducting materials conduct heat much better than air. Thus there is formed in the horizontal plane a temperature difference between the left hand and right hand ends (considering FIGS. 1 and 2) of each zone 3, i.e. between the longitudinal extremities of each elementary thermocouple or cell A, B, thereby generating an electromotive force of thermoelectric origin at the ends of each elementary cell or thermocouple A, B; now these thermocouples are connected together in series by strip 2 and a total, relatively high, potential difference is finally obtained between terminals E and S because a very large number of elementary cells or thermocouples are placed in series.

The same phenomenon occurs in the embodiment shown in FIGS. 5 and 6 (with overall arrangement in the plane, as shown in FIGS. 3 and 4), because the heat flux preferentially avoids the channels or holes 4b (due to the poor heat conductivity of air) when a temperature difference exists between the upper face and the lower face of the fluxmeter (considering FIG. 6); in fact, channels 4b create a dissymmetry in the horizontal plane because of their dissymetric position with respect to the centers of zones 3b and 3c, because the difference of temperature between the left hand and right hand ends (considering FIGS. 5 and 6) of zones 3b and 3c generates, in each elementary cell or thermocouple A', B', an electromotive force of thermoelectric origin. The different cells A', B' are connected in series by strip 2 and thus an overall, relatively high, electromotive force is obtained with the plurality of cells A', B' disposed as illustrated in FIGS. 3 and 4.

In a third embodiment illustrated in FIGS. 7 to 9, very thin discrete deposits 3d, for example of copper, are provided on a single side of the thin layer 2, for example of constantan, deposited on the support plate 1, for example made of "Kapton". But, contrary to the first embodiment, channels or holes 4c are, in the third embodiment shown in FIGS. 7 to 9, disposed so as to open out astride a deposit zone 3d and a portion 2b of the thin layer 2 not coated with the copper deposit 3d. Finally, as in the first embodiment, an upper protective layer 5d, for example made of "Mylar", may be provided.

The operating mode of the device shown in FIGS. 7 to 9 is similar to that of FIGS. 1 and 2, elementary cells such as shown in FIGS. 7 to 9 being disposed as illustrated in FIGS. 3 and 4.

In a modification, elementary cells could be formed having, as in the embodiments shown in FIGS. 5 and 6, deposits on each side of the thin continuous layer offset so that the channels open, as in the embodiments shown in FIGS. 7 to 9, astride a deposit and a portion not coated with the deposit of the continuous layer, and this on each side of the continuous layer.

Figure 10:
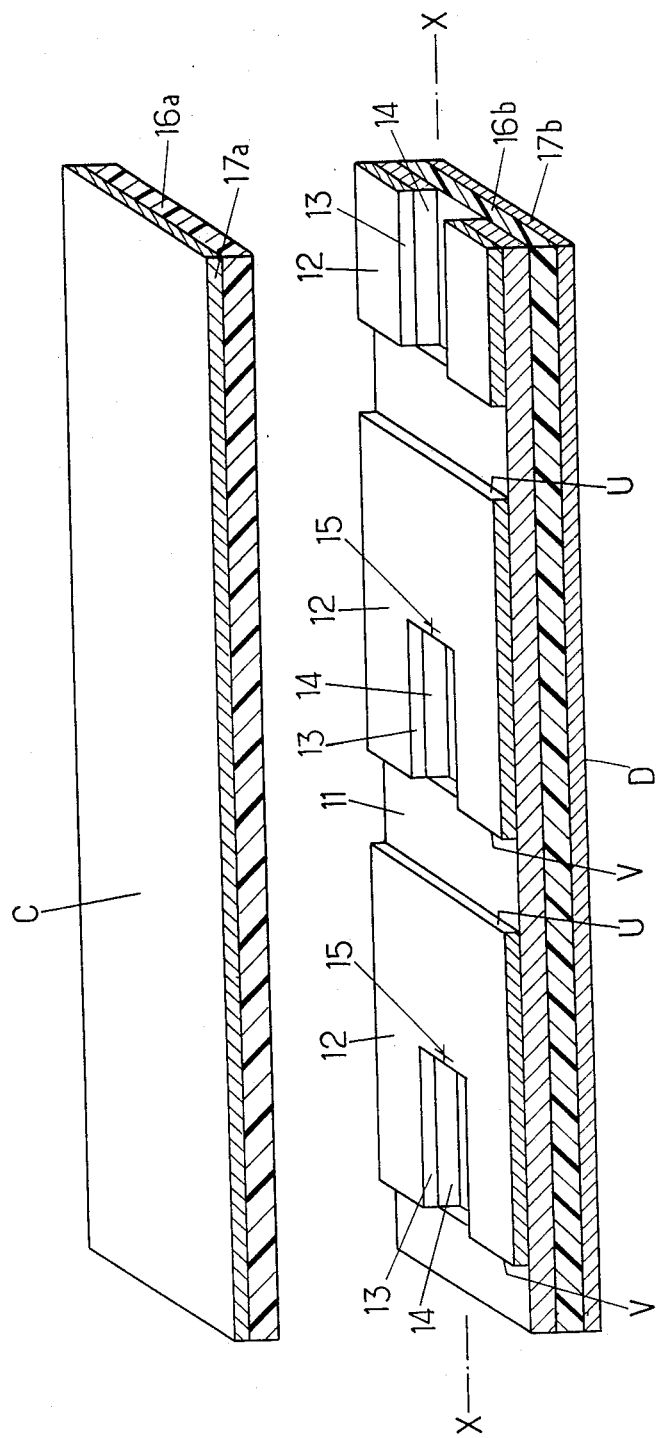
FIGS. 10 and 11 represent an exploded perspective view of portions of a fluxmeter according to another type of embodiment of the invention, respectively with one and two thin continuous layers.

Reference being now made to FIG. 10, a further type of embodiment of the invention will be described; this figure shows a small portion of a fluxmeter according to the invention with a single continuous strip, said portion incorporating only two elementary thermocouples (and the beginning of a third thermocouple) among the tens or hundreds or even thousands of thermocouples connected in series of a complete fluxmeter.

In FIG. 10, there can be found again the thin continuous strip, referenced 11, and the thinner deposited discrete zones, referenced 12.

The continuous strip 11 is made of a first conducting or semi-conducting material, such as constantan (in particular constantan with 35%–50% nickel and 65%–50% copper), whereas the deposits 12 are made of a second conducting or semi-conducting material, such as copper, which is different from the first material and has a thermoelectric power different from that of the first material.

Advantageously, the second material is a better heat and electricity conducting material than the first material.

In the embodiment shown in FIG. 10, the continuous strip or layer 11 is coated, on only one of its faces (the upper face in this Figure), with zones 12 of deposit, but there can also be provided such zones of deposit on both faces of the continuous strip 11.

Notches 13 have been made in the deposits (whether said deposits are arranged on one face only or on both faces of strip 11) and they go through the whole thickness of layer 11, as channels 14, however without interrupting the continuity of layer 11.

Notches 13 are offset, if one considers the direction X—X of elongation of a strip 11, in a same direction (towards the left) with respect to centers 15 of zones 12.

The assembly of the strip 11 and of the zones 12 of deposit (on one face or on both faces of strip 11) is arranged between two plates 16a and 16b of an insulating material, for example polyimide, particularly "Kapton", in order to form a "sandwich" (the two bread slices of which would be the two insulating plates 16a and 16b and the ham, or another edible product, would be constituted by the assembly 11-12). It will be noted that in order to facilitate the interpretation of FIG. 1, the upper plate 16a has been lifted off in relation to the remaining part of the sandwich.

Finally, the external surfaces of plates 16a and 16b, which are not in contact with the assembly 11-12, can be coated respectively, as shown, with the thin layers 17a, 17b of a heat conducting material, such as copper, in order to make the temperature uniform on the surface of plates 16a and 16b which are in contact with these heat conducting layers.

Actually, the fluxmeter according to the invention contains tens and even, preferably, hundreds of deposits 12 on one face or on each face of the continuous strip 11.

Advantageously, this continuous strip 11 is folded back on itself in order to present the meandering form shown in FIGS. 3 and 4, in such a way to be able to have a greater length of strip 11 available within a small rectangular or square surface; the surface could even be a circular one.

As a non-limiting example, the dimensions of a fluxmeter according to FIG. 10 are as follows;
 dimension of the sides of the square surface within which the continuous meandering strip is contained: 125 mm,
 length of the continuous meandering strip 11, assumed to be unfolded: 7 m,
 width of the continuous meandering strip 11: 1.8 mm,
 spacing between meanders: 0.4 mm,
 length of zones 12 of deposit: 2 mm,
 spacing between two successive zones 12 of deposit: 1 mm,
 number of deposits on one face of strip 11: 2330,
 width of notches 13 in the direction X—X: 1.6 mm,
 length of notches 13 in the direction perpendicular to X—X: 0.9 mm,
 thickness of the continuous strip of constantan 11: 25 microns,
 thickness of zones 12 of deposit in copper: 5 microns,
 thickness of insulating plates in kapton, 16a, 16b: 25 microns,
 thickness of the conducting layers 17a, 17b in copper: 50 microns.

Zones 12 have been obtained by electrolytic deposit on strip 11, whereby the assembly 11-12 constitutes a kind of printed circuit of 0.15 mm thickness approximately.

With such a structure comprising copper deposit zones 12 only on one face of the continuous strip 11, there was obtained a potential difference of 20 mV for a temperature difference of 1° K. between the external faces C and D of the copper layers 17a and 17b.

The operation of a fluxmeter of FIG. 10 is as follows:

Air is trapped in the recesses formed by the notches 13 and the channels 14 between the plates 16a and 16b. However, air is a poor heat conductor, particularly with respect to strip 11 (preferably of constantan) and the deposit zones 12 (preferably of copper). Consequently, the heat which flows between the plates 16a and 16b, which are respectively rendered isothermal by the conducting layers 17a and 17b (plate 16a being for example warmer than plate 16b), avoids, i.e. bypasses, these notches and channels.

The dissymmetrical arrangement of notches 13 and channels 14 with respect to the centers 15 of zones 12 therefore generates a thermal dissymmetry between the contacting boundaries at U, on the one hand, and at V, on the other hand, the constantan-copper and copper-constantan (for each zone 12 on the continuous strip 11), these couples being electrically connected in series by the continuous strip 11.

The elementary e.m.f.'s generated for each zone 12 at U and V therefore add up and one obtains a total e.m.f. which is sufficiently high to enable an accurate measurement to be made, this total e.m.f. being, as are the elementary e.m.f's, proportional to the temperature difference between faces C and D of the fluxmeter of FIG. 10.

Figure 11:
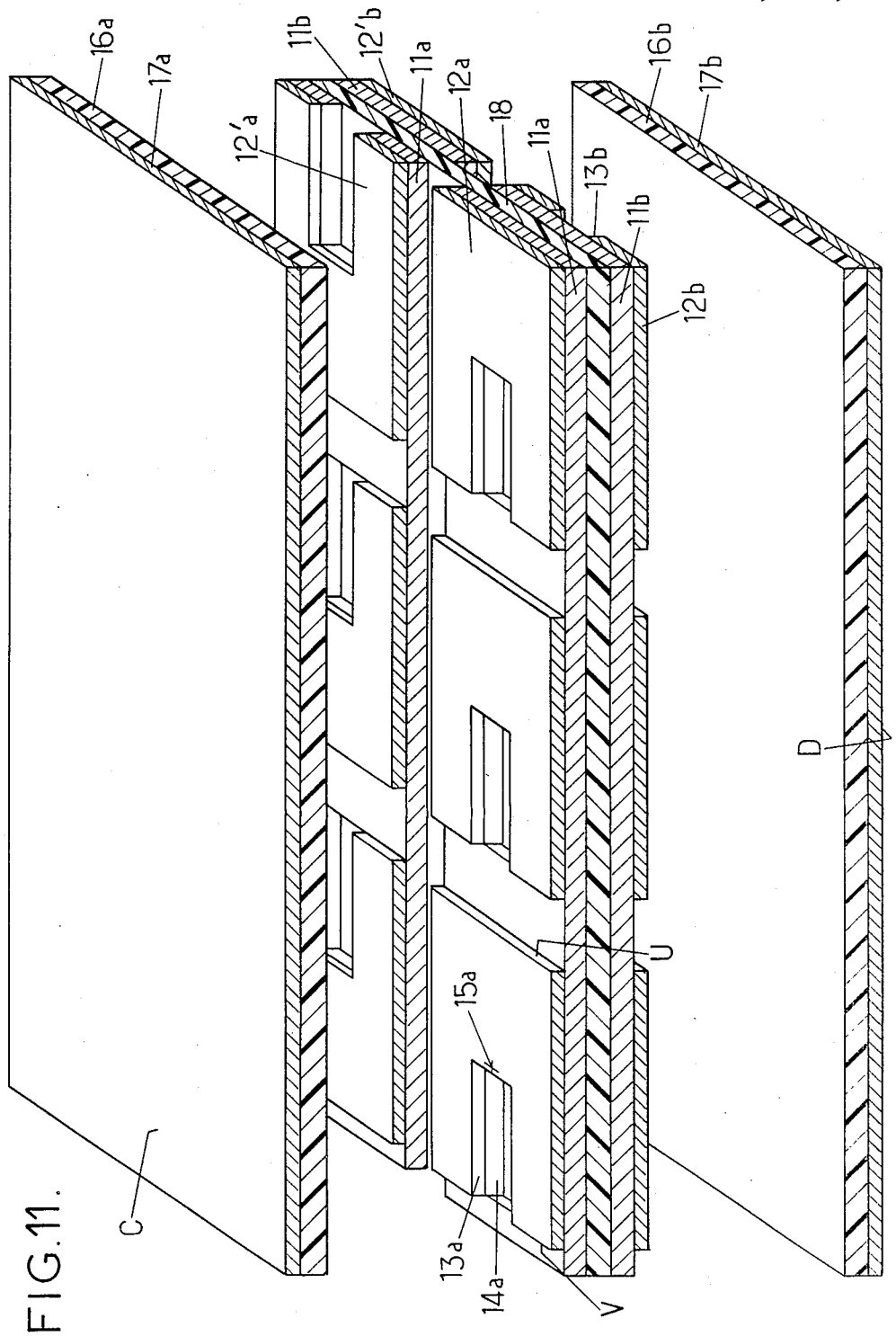

In FIG. 11, there is shown a modification of the fluxmeter according to FIG. 10 incorporating two thin continuous strips 11a and 11b, of a first conducting or semi-conducting material (constantan for example) deposited on both sides of an insulating central plate 18 (for example of Kapton).

On FIG. 11 is shown a portion of the fluxmeter, but this portion contains two adjacent meanders of strips 11a and 11b, whereas in FIG. 10 a single meander of strip 11 was illustrated.

Each strip 11a, 11b of FIG. 10 carries, like the strip 11 of FIG. 1, a succession of zones 12a, 12'a for strip 11a and zones 12b, 12'b for strip 11b, these zones being similar to zones 12 of strip 11 (FIG. 1), i.e. constituted by discrete deposits of a second conducting or semi-conducting (such as copper) material, the two materials having different thermoelectric powers.

As in the case of FIG. 10, there can be provided, as a modification, deposit zones on both faces of each strip 11a, 11b.

The assembly of these two strips 11a, 11b, with their deposit zones and a central plate 18, is arranged between two insulating plates 16a and 16b, each one of these being advantageously coated, on its external face, with a conducting layer 17a, 17b, for example of copper.

It will of course be noted that the orientation of the notches is opposite on two successive meanders of a same strip 11a or 11b (and also of a same strip 11) when they are seen in the folded position (whereas for the unfolded strip, the orientation of the notches is the same) in order that the elementary e.m.f.'s add up over the whole strip.

Furthermore, if one considers the notches of the two strips 11a and 11b, it can be established that for the two superimposed zones, they are offset in the reverse direction, for example for the front meanders of FIG. 11, the upper notches 13a are opened towards the left, whereas the lower notches 13b are opened towards the right.

The operation of the fluxmeter of FIG. 11 is similar to the operation of the fluxmeter of FIG. 10. When one temperature gradient is available between faces C and D of the fluxmeter, e.m.f.'s are available at the ends of the continuous strips 11a and 11b, these e.m.f.'s being themselves connected up in series.

The inventors have surprisingly ascertained that whenever elementary thermocouples are located on both sides of an intermediate plate 18, as is the case in the embodiment of FIG. 11, with notches 13a and 13b opposite with respect to the centers (such as 15a) of deposit 12a and 12b, the sensitivity of the fluxmeter, i.e. the ratio between the total electromotive force available and the temperature gradient between faces C and D, is multiplied by a factor greater than 2 (whereas one would have expected a factor equal to 2); this factor is in fact about 2.2.

The increase in the sensitivity is due to the fact that the boundaries of the electrolytic deposits, such as 12a and 12b, are no longer at the same temperature and that consequently the resulting total e.m.f. is equal to the sum of the elementary e.m.f.'s resulting from discontinuities in this temperature field and to the temperature differences between the boundaries, such as U and V, of the electrolytic deposits, each one of these components being of the same sign for the configuration shown in FIG. 11 these factors generate a multiplication of the sensitivity, relatively to a fluxmeter of the type shown in FIG. 10 with only one continuous strip 11, by a factor superior to 2.

As concerns the manufacture of a fluxmeter according to FIG. 10, it comprises two successive steps:

(1) The manufacture of the active part of the fluxmeter; this first phase comprises the following operations:

one starts with a composite foil of kapton-constantan (16b-11), such foils being available on the market;

one deposits electrolytically a layer of copper on the constantan face (11) of the aforesaid foil;

one removes a portion of copper to be eliminated by means of a selective engraving solution which etches the copper, thereby leaving the constantan intact, but forming the zones of deposit (12);

one engraves, on the one hand, the line spacings between the meanders of constantan in order to obtain the geometrical configuration shown in FIGS. 3 and 4 and, on the other hand, the notches (14) in the constantan strip (11), by means of an engraving solution which etches the constantan.

(2) The manufacture of the completed fluxmeter; this second phase consists in gluing a kapton foil (16a) on the active part of the fluxmeter obtained in the first phase, this foil being applied onto the copper coated zones (12) of the active part.

This second phase is relatively critical since the purpose is to establish an excellent thermal contact between the zones (12) of the electrolytic copper and the kapton of the second foil (16a).

To this end, a glue (for example of the cyanoacrylate type which only polymerizes at the contact zones with the copper deposits) is applied onto the face of this second foil which comes into contact with the deposit zones, the second foil is then swiftly applied onto the active part resulting from the first phase and in the relative position shown on FIG. 10, and one proceeds with the polymerization of the glue.

In the case of a "high temperature" application of a fluxmeter according to the invention, a "high temperature" glue, such as the one known under the brandname "Epoteckny" (which retains its properties up to temperatures as high as 300° C. for example) will be used.

The electrolytic copper layers (17a and 17b) can of course be advantageously deposited onto the external kapton faces (16a, 16b).

Obviously many modifications and variations of the present invention are possible in the light of the above teachings. It is therefore to be understood that within the scope of the appended claims the invention may be practiced otherwise than as specifically described.

We claim:

1. A thermocouple array for a thermal fluxmeter with a multiplicity of elementary thermocouples, comprising
   a continuous layer of a first material selected from the group consisting of conducting and semi-conducting materials, said continuous layer having top and bottom faces and defining a longitudinal direction,
   said layer being coated on at least one of its faces with a succession of discrete zones of deposit of a second material selected from the group consisting of conducting and semi-conducting materials and having a thermoelectric power different from that of the first material,
   at least one respective channel traversing each of at least most of said zones and the underlying continuous layer, these channels being offset in a given longitudinal direction with respect to the center of each zone passed through, said channels creating a geometrical dissymmetry in each said zone passed through, thereby causing a difference in heat conductivity along the longitudinal direction in each said zone, and electrically insulating layers on the top and bottom of the assembly which includes said continuous layer and said succession of discrete zones of deposit, said difference in heat conductivity along the longitudinal direction causing a temperature difference between the longitudinal extremities of each of said zones and thereby providing the generation of an electric potential of thermoelectric origin, when a difference of temperature exists between said two electrically insulating layers.

2. The thermocouple array thermal fluxmeter according to claim 1, wherein said channels are coated on the inside with a deposit of the second material.

3. The thermocouple array according to claim 1, wherein said continuous layer is in the form of a meandering thin strip.

4. The thermocouple array according to claim 1, wherein the continuous layer is deposited on a substrate made from an electrically insulating material, which forms one of said electrically insulating layers, and said continuous layer is coated with said deposit zones only on the face thereof opposite the face fixed to the substrate, and with an electrically insulating material which forms the other of said electrically insulating layers.

5. The thermocouple array according to claim 1, wherein each channel opens inside a deposit zone.

6. The thermocouple array according to claim 1, wherein each channel opens astride a deposit zone and a non-coated portion of the continuous layer.

7. The thermocouple array according to claim 1, wherein the first material is constantan.

8. The thermocouple array according to claim 1, wherein the second material is copper.

9. The thermocouple array according to claim 1, wherein the succession of deposit zones and the non-coated portions of the continuous layer are covered with a protective resin layer, constituting one of said insulating layers.

10. A thermocouple array for a thermal fluxmeter comprising:
at least one continuous strip of a first material selected from the group consisting of conducting and semi-conducting materials, said continuous strip having top and bottom faces and defining a direction of elongation thereof;
a succession of discrete zones consisting of discontinuous deposits of a second material selected from the group consisting of conducting and semi-conducting materials, these zones being successively located on at least one of the faces of said strip along said direction of elongation thereof and these two materials having different thermoelectric powers;
two covering plates of an electrically insulating material; and,
at the level of said discrete zones, a notch cutting out each of at least most of said deposits while being surrounded on most of the periphery of said notch by said deposits, said notch being extended by a channel traversing said continuous strip without however interrupting the continuity thereof and being offset in one direction, when considering the elongation direction of the continuous strip, with respect to the center of the corresponding deposit zone;
said notch and channel creating a geometrical dissymmetry in said zone passed through, thereby causing a difference in heat conductivity along the elongation direction, and hence, when a difference of temperature exists between said two covering plates, a difference between the temperatures of the ends of said zone along the direction of elongation, said temperature difference providing the generation of an electric potential of thermoelectric origin.

11. Fluxmeter according to claim 10, wherein the external face of each covering plate, which is not in contact with said continuous strip, is coated with a layer of a heat conducting material.

12. Fluxmeter according to claim 10, wherein said channels are inwardly coated with a layer of a heat and electricity conducting material.

13. Fluxmeter according to the claim 10, wherein said continuous strip is covered with deposits on one face only.

14. Fluxmeter according to claim 10, wherein said continuous strip is coated with deposits on both its faces.

15. Fluxmeter according to the claim 10, including a second such array, including a second continuous strip, said continuous strips having a central plate of an insulating material inserted between them.

16. Fluxmeter according to claim 10, wherein said continuous strip forms a meandering structure.

17. Fluxmeter according to claim 10, wherein the first material is constantan.

18. Fluxmeter according to claim 10, wherein the second material is copper.

19. Fluxmeter according to claim 10, wherein a plurality of said notches and channels are provided in a corresponding plurality of said zones.

20. A thermocouple array for a thermal fluxmeter with a multiplicity of elementary thermocouples, comprising
a continuous layer of a first material selected from the group consisting of conducting and semi-conducting materials, said continuous layer having top and bottom faces and defining a longitudinal direction,
said layer being coated on both of its faces with a succession of discrete zones of deposit of a second material selected from the group consisting of conducting and semi-conducting materials and having a thermoelectric power different from that of the first material, each of the zones on one of the faces partially overlapping a corresponding one of the zones on the other face of the continuous layer,
at least one respective channel traversing each of at least most of said zones and the underlying continuous layer, by passing not only through the continuous layer but also through the overlapping portions of both of the two overlapping deposit zones on both faces of the continuous layer, these channels being offset longitudinally with respect to the center of each zone passed through, said channels being offset in a given longitudinal direction on one of said faces, and being offset in the opposite longitudinal direction with respect to the center of each zone on the other of said faces, and
electrically insulating layers on the top and bottom of the assembly which includes said continuous layer and said succession of discrete zones of deposit on both faces of said layer,
thereby providing the generation of an electric potential of thermoelectric origin when a difference of temperature exists between said two insulating layers.

21. A thermocouple array for a thermal fluxmeter comprising:
- first and second continuous strips of a first material selected from the group of consisting of conducting and semi-conducting materials, each said continuous strip having top and bottom faces and defining a direction of elongation thereof, said continuous strip being adhered to a central plate of an electrically insulating material inserted between them;
- a succession of discrete zones comprising discontinuous deposits of a second material selected from the group consisting of conducting and semi-conducting materials, these zones being successively located on the top face of each said strip along said direction of elongation thereof, said first and second materials having different thermoelectric powers;
- two covering plates of an electrically insulating material; and,
- at the level of said discrete zones, a notch cutting out each of at least most of said deposits while being surrounded on most of the periphery of said notch by said deposits, said notch being extended by a channel traversing said continuous strip without however interrupting the continuity thereof and being offset in one direction, when considering the elongation direction of the continuous strip, with respect to the center of the corresponding deposit zone;
- said notch and channel creating a geometrical dissymmetry in said zone passed through, thereby causing a difference in heat conductivity along the elongation direction, and hence, when a difference of temperature exists between said two covering plates, a difference between the temperature of the ends of said zone along the direction of elongation, said temperature difference providing the generation of an electric potential of thermoelectric origin; and
- the offset of said notches and said channels which correspond to one of the continuous strips being in the opposite direction, when considering the elongation direction of the strips, with respect to the offset of the notches and channels which correspond to the other continuous strip.

* * * * *